(12) United States Patent
Chapman et al.

(10) Patent No.: US 7,732,885 B2
(45) Date of Patent: Jun. 8, 2010

(54) SEMICONDUCTOR STRUCTURES WITH DUAL ISOLATION STRUCTURES, METHODS FOR FORMING SAME AND SYSTEMS INCLUDING SAME

(75) Inventors: James M. Chapman, Boise, ID (US); Salman Akram, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 181 days.

(21) Appl. No.: 12/027,697

(22) Filed: Feb. 7, 2008

(65) Prior Publication Data
US 2009/0200633 A1 Aug. 13, 2009

(51) Int. Cl.
*H01L 29/00* (2006.01)
(52) U.S. Cl. .................. 257/446; 257/506; 257/544; 257/E27.13
(58) Field of Classification Search .............. 257/446, 257/506, 544, E27.13
See application file for complete search history.

(56) References Cited

U.S. PATENT DOCUMENTS

| | | | |
|---|---|---|---|
| 5,858,830 A | 1/1999 | Yoo et al. | |
| 5,874,328 A | 2/1999 | Liu et al. | |
| 6,737,624 B1 | 5/2004 | Toma | |
| 6,967,316 B2 | 11/2005 | Lee | |
| 7,122,840 B2 | 10/2006 | Hsu et al. | |
| 7,157,754 B2 | 1/2007 | Nagasaki et al. | |
| 7,187,023 B2 | 3/2007 | Yoshihara | |
| 7,411,173 B2 * | 8/2008 | Park | 250/214.1 |
| 2002/0187615 A1 | 12/2002 | Liou | |
| 2005/0127462 A1 * | 6/2005 | Rim et al. | 257/428 |
| 2005/0233541 A1 | 10/2005 | Shin et al. | |
| 2006/0275945 A1 | 12/2006 | Yang et al. | |
| 2007/0004076 A1 | 1/2007 | Lee et al. | |
| 2007/0045684 A1 | 3/2007 | Lee | |
| 2007/0069238 A1 | 3/2007 | Tatani et al. | |
| 2007/0077678 A1 | 4/2007 | Oh et al. | |
| 2007/0092985 A1 | 4/2007 | Yoshihara | |
| 2007/0166952 A1 | 7/2007 | Yun | |

FOREIGN PATENT DOCUMENTS

| | | |
|---|---|---|
| CN | 1877847 | 12/2006 |
| DE | 2005100063113 | 1/2007 |
| JP | 2003218337 A | 7/2003 |
| KR | 20010056122 | 12/1998 |
| WO | 2004010506 | 1/2004 |

OTHER PUBLICATIONS

Moon et al., Application of Plasma-Doping (PLAD) Technique to Reduce Dark Current of CMOS Image Sensors, IEEE Electron Device Letters, vol. 28, No. 2, Feb. 2007, pp. 114-116.
Hsu et al., An Effective Method to Improve the Sensitivity of Deep Submicrometer CMOS Image Sensors, IEEE Electron Device Letters, vol. 26, No. 8, Aug. 2005, pp. 547-549.
Intel Technology Journal, vol. 6, Issue 2, published May 16, 2002, http://developer.intel.com/technology/itj/index.htm.

* cited by examiner

*Primary Examiner*—Zandra Smith
*Assistant Examiner*—Christy L Novacek

(57) ABSTRACT

A semiconductor structure with dual isolation structures is disclosed. The semiconductor structure may include a protruding isolation structure in a pixel array region of a substrate and an embedded isolation structure in a peripheral device region of the same substrate. A region of the protruding isolation structure extends from an upper surface of the substrate, while another region of the protruding isolation structure may, optionally, be embedded within the substrate. The embedded isolation structure is formed within the substrate and includes an upper surface that is substantially coplanar with the upper surface of the substrate. A method of forming the semiconductor structure with dual isolation structure is also disclosed.

1 Claim, 7 Drawing Sheets

SEMICONDUCTOR STRUCTURES WITH DUAL ISOLATION STRUCTURES, METHODS FOR FORMING SAME AND SYSTEMS INCLUDING SAME

FIELD OF THE INVENTION

Embodiments of the present invention relate generally to the fabrication of semiconductor structures and, more specifically, to methods for forming a semiconductor structure having dual isolation structures and the resulting semiconductor structures.

BACKGROUND

Integrated imaging circuits are widely used to produce video and photographic images in digital cameras, copiers, scanners and other devices. Most integrated imaging circuits employ an array of photoactive pixels arranged in rows and columns for capturing images projected on the array. The pixels typically include photoactive or photoreceptive devices, such as photodiodes, in addition to adjacent transistor structures, such as transfer gate structures and reset transistors. Incident light that impacts an image sensor cell discharges the photodiode such that the resulting voltage drop can be used to determine the intensity level of the incident light. The transistors, as well as additional devices used for control and signal circuits in the peripheral regions of the image sensor cell, include complementary metal oxide semiconductor (CMOS) devices.

Shallow trench isolation (STI) is a known technique used to isolate pixels, devices or circuitry from one another in an imaging device. A trench is etched into a substrate and filled with a dielectric material, such as silicon dioxide ($SiO_2$), to provide a physical and electrical barrier between adjacent pixels, devices, or circuitry. FIG. 1 illustrates a photodiode 100 with shallow trench isolations (STIs) 132 within the substrate 101. The photodiode 100 also includes p-well regions 126, an n-well region 128 and conductive gates 125. The STIs 132 have a depth of about 0.2 μm. Incident light travels into an interface between the p-well and the n-well (the p-n junction). When the p-n junction diode is reverse biased by application of a voltage to the p-n junction, a depletion region 129 forms as electrons diffuse from the n-well region 128 to the p-well regions 126. As a result, electron hole pairs are generated both inside and outside the depletion region 129. The photo-generated electron hole pairs diffuse and drift into the depletion region 129, inducing a photo current representing a portion of the image to which the photodiode was exposed.

During the STI process, a number of lattice defects, such as dangling bonds and stress-induced defects, may be introduced at vertical surfaces 130 in the substrate 101. Such defects may lead to the accumulation of electron hole pairs at the interface between the substrate 101 and the vertical surfaces 130 within the substrate 101. As voltage is applied, the depletion region 129 extends toward the vertical surfaces 130 in the substrate 101 in the vicinity of the oxide material of the STI, resulting in the accumulation of electron hole pairs at the interface of the STI 132 and depletion region 129. Accumulation of electron hole pairs resulting from damaged vertical surfaces 130 in the substrate 101 may have detrimental effects on the function of the photodiode. Such effects include an increased level of reverse bias leakage or dark current in the photodiodes. As used herein, the term "dark current" means and includes the leakage current discharged from a photodiode even when there is no incident light upon the image sensing element. Dark current arises from stress-related dislocations, such as dangling bonds, formed in the area around the interface between STIs 132 and the depletion region 129.

U.S. Pat. No. 7,187,023 to Yoshihara describes a solid-state imaging device having a first element isolation layer in a pixel array region of a semiconductor substrate and a second element isolation layer in a peripheral device region of the semiconductor substrate. The first element isolation layer is located partially within the semiconductor substrate and extends above the surface of the semiconductor substrate. The second element isolation layer is an STI and a portion thereof is formed within the semiconductor substrate and a portion thereof protrudes above the surface of the semiconductor substrate.

Wile imager devices fabricated using STI processes have achieved a relatively high level of commercial success, such imager devices exhibit some undesirable structural characteristics and operational deficiencies. Thus, there is a need in the art for imager device designs and fabrication processes resulting in imager devices having increased efficiency, reliability and durability.

DETAILED DESCRIPTION OF THE INVENTION

In the following detailed description, reference is made to the accompanying drawings which form a part hereof and in which is shown by way of illustration specific embodiments in which the present invention may be practiced. These embodiments are described in sufficient detail to enable those of ordinary skill in the art to practice the present invention, and it is to be understood that other embodiments may be utilized, and that structural, logical, and electrical changes may be made without departing from the spirit and scope of the present invention.

The methods disclosed herein may be used to fabricate a variety of devices, such as imager devices, memory devices, and other devices in which dual isolation structures are suitable and reduction in dark current is desired.

The methods and semiconductor structures described herein do not form a complete process flow for processing semiconductor structures. The remainder of the process flow is known to those of ordinary skill in the art. Accordingly, only the methods and semiconductor structures necessary to understand embodiments of the present invention are described herein. The materials described herein may be formed by a suitable deposition technique including, but not limited to, spin coating, blanket coating, high density plasma ("HDP") deposition, chemical vapor deposition ("CVD"), atomic layer deposition ("ALD"), plasma enhanced ALD, pulsed layer deposition ("PLD") or physical vapor deposition ("PVD"). Depending on the material to be used, the deposition technique may be selected by a person of ordinary skill in the art.

Reference will now be made to the figures wherein like numerals represent like elements. The figures are not necessarily drawn to scale.

Figure 2:
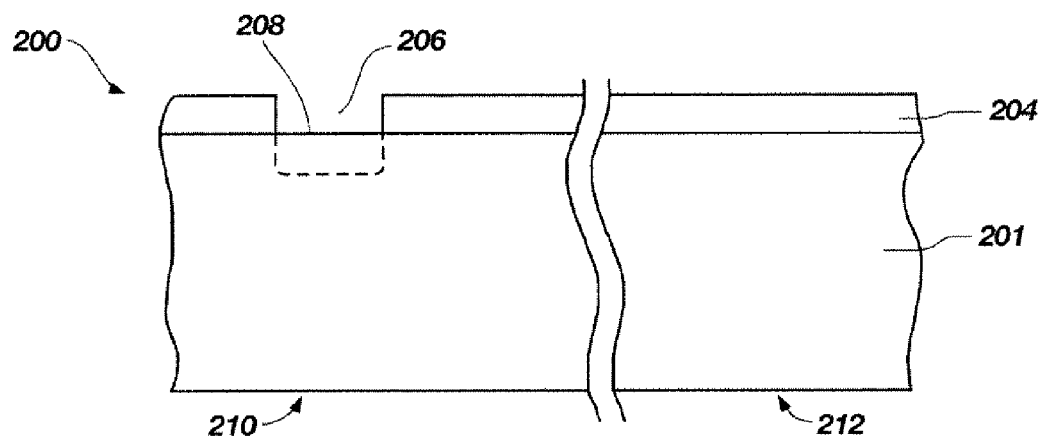
FIGS. 2-14 are cross-sectional views of embodiments of semiconductor structures of the present invention during various stages of fabrication.

FIG. 2 illustrates a semiconductor structure 2 that includes an opening 206 in a dielectric material 204 disposed over a substrate 201. As used herein, the term "substrate" means and includes a base material or construction upon which materials, such as the dielectric material 204 and mask material (not shown), are deposited. The substrate 201 may be a semiconductor substrate, a base semiconductor layer on a supporting structure, a metal electrode or a semiconductor substrate having one or more layers, structures or regions formed thereon. The substrate 201 may include, for example, silicon-on-insulator (SOD) type substrates, silicon-on-sapphire (SOS) type substrates, and epitaxial layers of silicon supported by a layer of base material. Semiconductor type materials may be doped or undoped. The substrate 201 may include a pixel array region 210 where photodiodes may be formed as well as a peripheral device region 212. The dielectric material 204 may be any material capable of being selectively removed with respect to the substrate 201. For example, the dielectric material 204 may be a low-k dielectric material, a high-k dielectric material, an oxide or a nitride, such as silicon nitride. The dielectric material 204 may be applied over the substrate 201 by CVD, PVD or other conventional techniques.

A portion of the dielectric material 204 may be removed to form the opening 206 using a mask material (not shown) such as a positive or negative photoresist material or a hardmask material, such as transparent carbon or amorphous carbon. The mask material may be deposited on the dielectric material 20 and patterned to form an aperture (not shown) exposing a region of the dielectric material 204 where the opening 206 is to be formed. The dielectric material 204 exposed through the aperture may be removed to form the opening 206, which exposes a region of the upper surface 208 of the substrate 201. For example, if the dielectric material 204 is formed from silicon nitride, a wet etch using nitrogen trifluoride/hydrogen bromide ($NF_3$/HBr) solution or a solution containing phosphoric acid ($H_3PO_4$) and water at a temperature in a range of from about 145° C. to about 180° C. may be employed to remove a portion of the silicon nitride exposed through the aperture to form the opening 206.

Alternatively, the opening 206 may extend into the substrate 201 as shown by phantom lines in FIG. 2. The opening 206 may be extended into the substrate 201 by removing a portion of the substrate 201 exposed after removal of the dielectric material 20. For example, where the dielectric material 204 is formed from silicon nitride and the substrate 201 is formed from silicon, a plasma etch using ambient carbon tetrafluoride ($CF_4$), methane ($CH_2$), fluoride ($F_2$) or helium (He) gas may be employed to etch both silicon nitride and silicon. The opening 206 may be, alternatively, extended into the substrate 201 subsequent to removal of the mask material by selectively removing a portion of the substrate 201 exposed through the opening 206 in the dielectric material 204. For example, if the substrate 201 is formed from silicon and the dielectric material 204 is formed from silicon nitride, a dry etch using conventional plasma etch chemistries, such as sulfur hexafluoride ($SF_6$), hydrogen bromide (HBr), or hydrogen chloride (HCl), may be employed to selectively remove the silicon over the silicon nitride.

Figure 3:
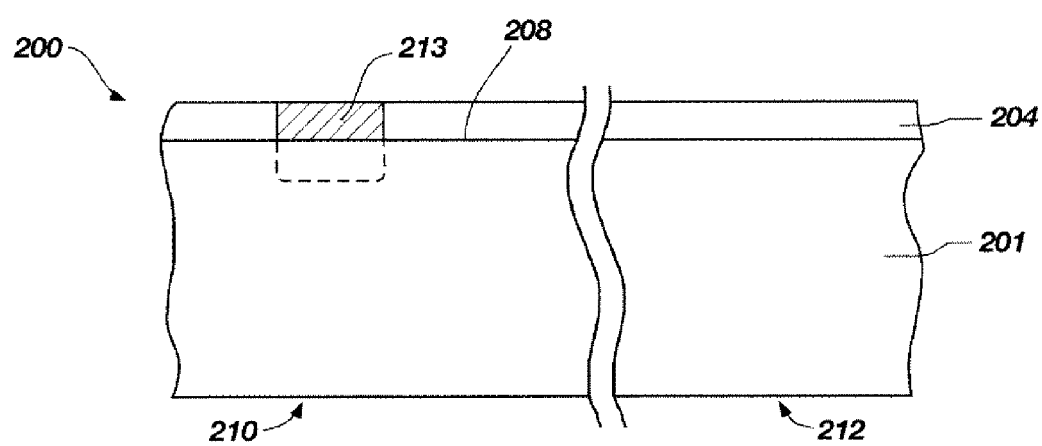

Referring to FIG. 3, an opening-filling material 213 may be applied over the dielectric material 204 to fill the opening 206. The dielectric material 204 and the opening-filling material 213 may be materials capable of being selectively etched with respect to one another. By way of non-limiting example, the opening-filling material 213 used to fill the opening 206 may be a low-k dielectric material, a high-k dielectric material, a nitride material or an oxide material, such as silicon dioxide. The opening-filling material 213 may be applied using any method known in the art. In one embodiment, the opening-filling material 213 is silicon dioxide deposited using HDP deposition.

Portions of the opening-filling material 213 overlying the dielectric material 204 may be removed to form a protruding isolation structure 214 (illustrated in FIG. 4), at least a portion of which extends from the upper surface 208 of the substrate 201. For the sake of clarity, the protruding isolation structure 214 is referred to as such because, while the protruding isolation region 214 is within the dielectric material 204 at this stage of processing, at least a portion of the protruding isolation structure 214 extends from the upper surface of the substrate 201 after subsequent processing (see, for example, FIG. 8). Removal of portions of the opening-filling material 213 overlying the dielectric material 204 may result in the protruding isolation structure 214 with a height in the range of from about 0.1 μm to about 0.2 μm. Employing methods known in the art such as, for example, chemical mechanical polishing (CMP), a portion of the opening-filling material 213 may be removed such that an upper surface 205 of the protruding isolation structure 214 is substantially coplanar with an upper surface 207 of the dielectric material 204. As used herein, the term "substantially coplanar" means and includes at least two surfaces lying in substantially the same plane, each surface being level with the at least one other surface.

Figure 4:
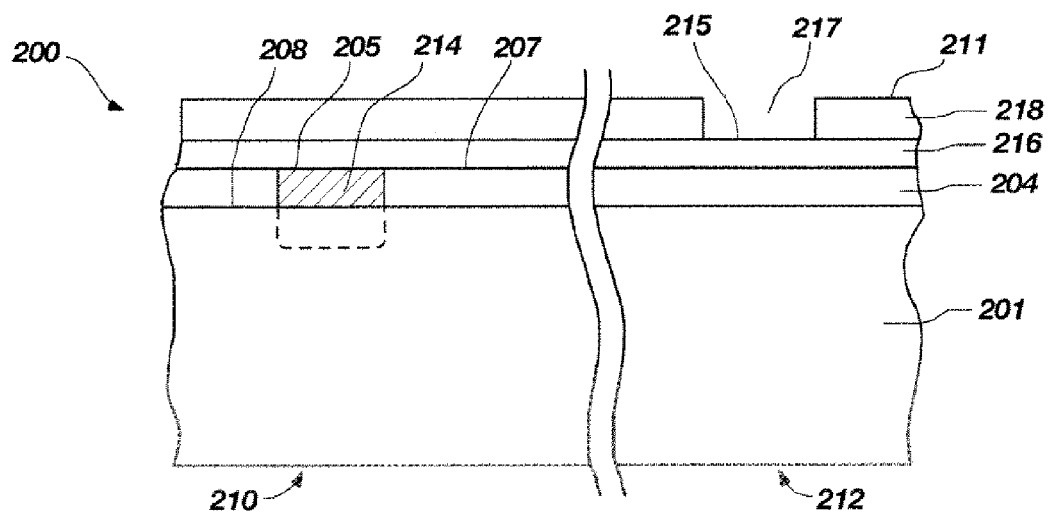

Referring to FIG. 4, another dielectric material 216 and a mask material 218 may be applied over the dielectric material 204 and the protruding isolation structure 214. The another dielectric material 216 may be formed from materials including, but not limited to, a low-k dielectric material, a high-k dielectric material, a nitride material, or an oxide material. By way of non-limiting example, the another dielectric material 216 may be formed from silicon nitride deposited by CVD, PVD, or other conventional techniques. The mask material 218 may be, for example, a photoresist material or a hardmask material, such as transparent carbon or amorphous carbon. A region of an upper surface 215 of the another dielectric material 216 may be exposed by forming an aperture 217 in the mask material 218. For example, where the mask material 218 is a photoresist material, the aperture 217 may be formed by applying and patterning the photoresist material by techniques known in the art.

Figure 5:
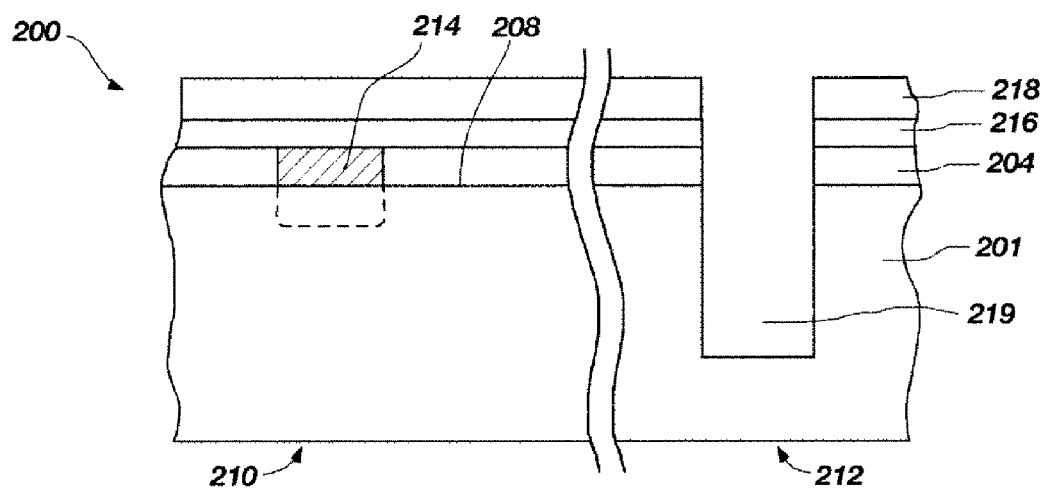

As illustrated in FIG. 5, a portion of each of the another dielectric material 216, the dielectric material 204, and the substrate 201 may be removed to form a trench 219 in the substrate 201. As a non-limiting example, the trench 219 may be formed in a region of the peripheral device region 212 of the substrate 201. The trench 219 may be formed by removing a portion of the another dielectric material 216, the dielectric material 204, and the substrate 201 through the aperture 217 in the mask material 218. Alternatively, a portion of the another dielectric material 216 and the dielectric material 204 may be removed through the aperture 217 in the mask material 218. The mask material 218 may be stripped and a portion of the substrate 201 may be removed selectively with respect to the another dielectric material 216 and the dielectric material 204. For example, if the dielectric material 204 and the another dielectric material 216 are silicon nitride, a hot phosphoric acid etch may be employed to remove the silicon nitride through the aperture 217 in the mask material 218. After removal of the mask material 218, a portion of the substrate 201 may be selectively removed with respect to the dielectric material 204 and the another dielectric material 216. Thus, the dielectric material 204 and the another dielectric material 216 are employed as a mask. As a non-limiting example, if the dielectric material 204 and the another dielectric material 216 are formed from silicon nitride and the substrate 201 is formed from silicon, a wet etch using tetramethylammonium hydroxide (TMAH) may be employed to remove silicon relative to silicon nitride.

Figure 6:
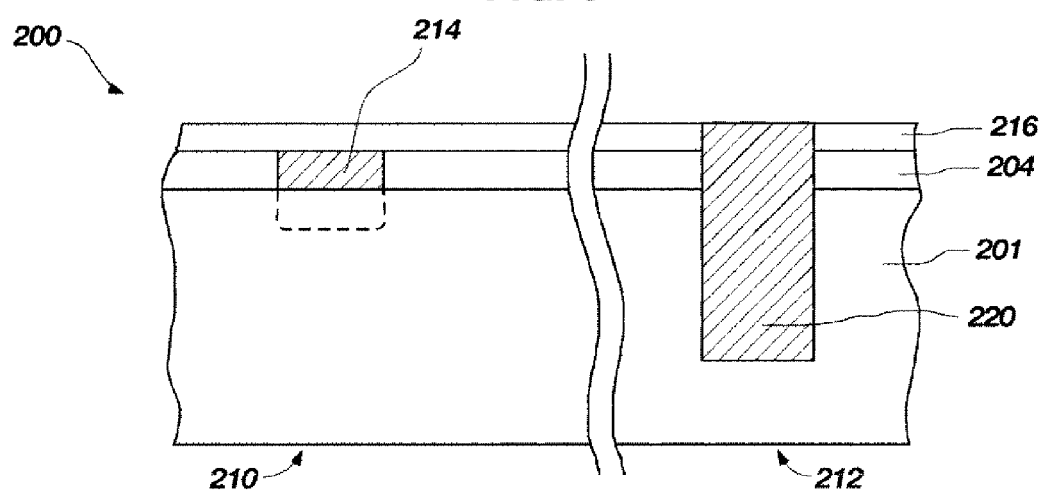

As illustrated in FIG. 6, a trench-filling material 220 may be applied over the another dielectric material 216 to fill the trench 219. The trench-filling material 220 may be, for example, a low-k dielectric material, a high-k dielectric material, a nitride material or an oxide material deposited by conventional techniques including, but not limited to HDP deposition, CVD, PVD, ALD, and the like. The trench-filling material 220 may be formed from a dielectric material that is capable of being selectively removed relative the dielectric material 20 and the another dielectric material 216. For example, the trench-filling material 220 may be silicon dioxide deposited by HDP deposition, while the dielectric material 204 and the another dielectric material 216 may be silicon nitride.

Figure 7:
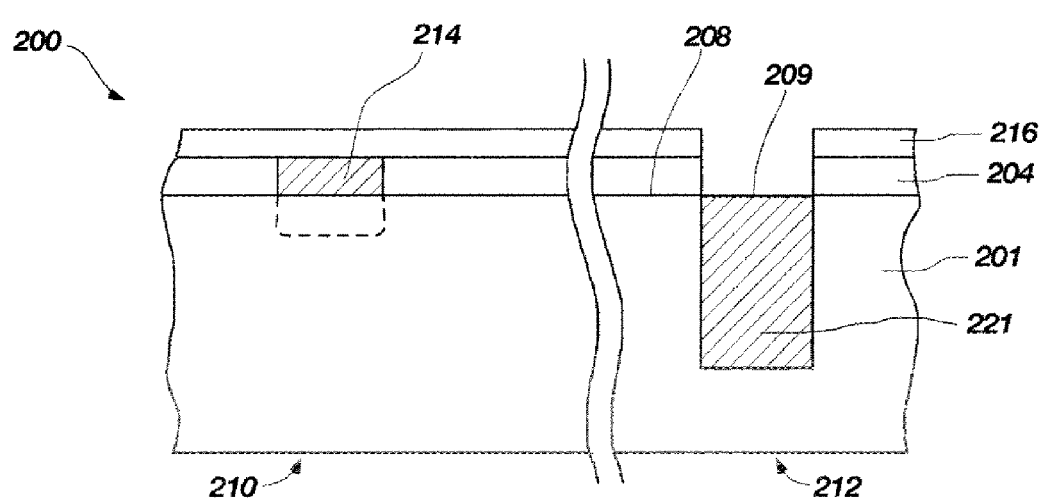

Referring to FIG. 7, a portion of the trench-filling material 220 may be removed to for an embedded isolation structure 221 within the substrate 201. The embedded isolation structure 221 may have a height of about 0.2 µm. An upper surface 209 of the embedded isolation structure 221 may be substantially coplanar with the upper surface 208 of the substrate 201. As such, the embedded isolation structure 221 is completely within the substrate 201 and does not substantially extend above the upper surface 208 of the substrate 201. In removing the portion of the trench-filling material 220 overlying the upper surface 208 of the substrate 201, the dielectric material 204 overlying the substrate 201 and the another dielectric material 216 may be employed as a self-aligning mask. By way of non-limiting example, the trench-filling material 220 is formed from silicon dioxide while the dielectric material 204 and the another dielectric material 216 are formed from silicon nitride. In such an example, the trench-filling material 220 may be selectively etched relative to the dielectric material 204 and the another dielectric material 216 using a buffered hydrogen fluoride (HF) etch. Employing the dielectric material 204 and the another dielectric material 216 as a mask to form the embedded isolation structure 221 eliminates the use of another mask material, thus enabling fabrication of a semiconductor structure having dual isolation structures using fewer process acts than conventional methods.

Figure 8:
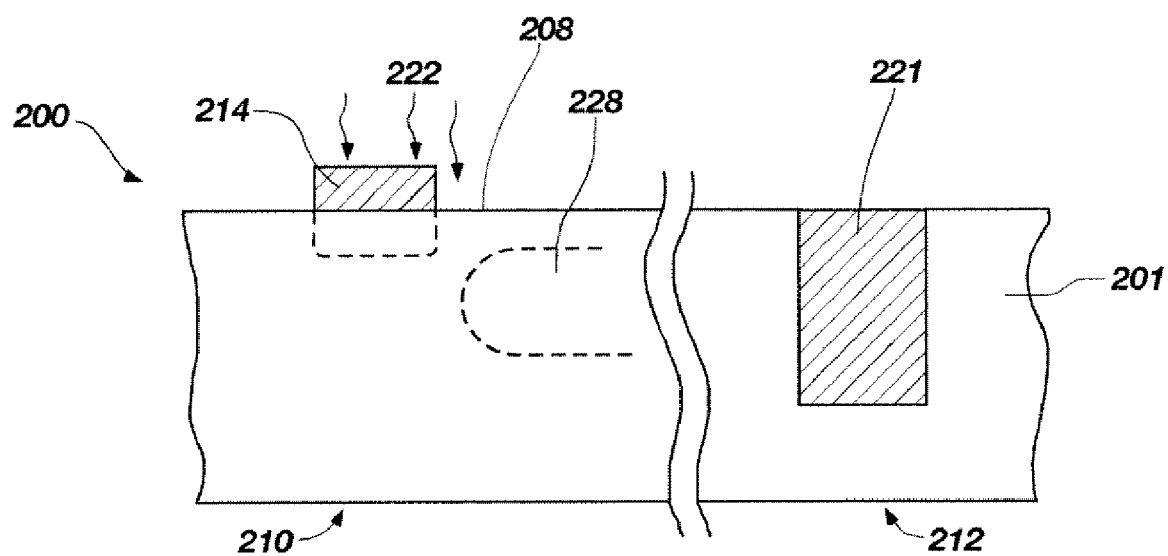

As illustrated in FIG. 8, the dielectric material 204 and the another dielectric material 216 may be removed, resulting in the semiconductor structure 200 including both the protruding isolation structure 214 and the embedded isolation structure 221. By way of non-limiting example, the dielectric material 204 and the another dielectric material 216 may be formed from silicon nitride while the protruding isolation structure 214 and the embedded isolation structure 221 are formed from silicon dioxide and the substrate 201 is formed from silicon. In such an example, the dielectric material 204 and the another dielectric material 216 may be selectively removed without removing the protruding isolation structure 214, the embedded isolation structure 221 or the substrate 201 using a conventional etch chemistry, such a $NF_3/HBr$ etch or hot $H_3PO_4$ etch. However, as would be recognized by one of skill in the art, other conventional etch chemistries may be used to remove silicon nitride without removing silicon dioxide and silicon. The resulting semiconductor structure 200 includes an embedded isolation structure 221 within the substrate 201 and a protruding isolation structure 214 with a region extending from the upper surface 208 of the substrate 201. In some embodiments, the protruding isolation structure 214 may include a region within the substrate 201 as shown by the phantom lines in FIG. 8.

Thus, the formation of damaged vertical surfaces within the substrate 201 may be reduced or eliminated by the methods described herein. More specifically, trench etching used to form conventional isolation structures, such as STIs, may create damaged surfaces (i.e., dangling bonds) at vertical surfaces within the substrate 201 resulting in the accumulation of electron hole pairs at the damaged surface. The accumulation of electron hole pairs at damaged surfaces results in undesirable dark current effects in a photodiode as the depletion region extends toward the surface. Thus, the protruding isolation structure 214 reduces or eliminates dark current effects associated with the interaction of the depletion region with the vertical surfaces.

The protruding isolation structure 214 and the embedded isolation structure 221 may optionally be employed as a mask for doping the substrate 201 by ion implantation 222, as shown in FIG. 8. For example, the substrate 201 may be doped using ion implantation 222 to form an n-well 228 in the substrate 201, while the material of the substrate 201 underlying the protruding isolation structure 214 is protected from ion implantation 222. Using the protruding isolation structure 214 and the embedded isolation structure 221 as a self-aligned mask reduces processing acts, thus reducing the cost of fabricating photodiodes. Moreover, dark current (or current leakage) may be reduced by forming the p-n junction at a distance from the surface of the substrate 201 using protruding isolation structure 214 and the embedded isolation structure 221 as an implantation mask.

The semiconductor structure 200 including protruding isolation structure 214 and the embedded isolation structure 221 (depicted in FIG. 8) may, alternatively, be formed by the method described below and illustrated in FIGS. 9-14, wherein like numerals represent like elements.

Figure 9:
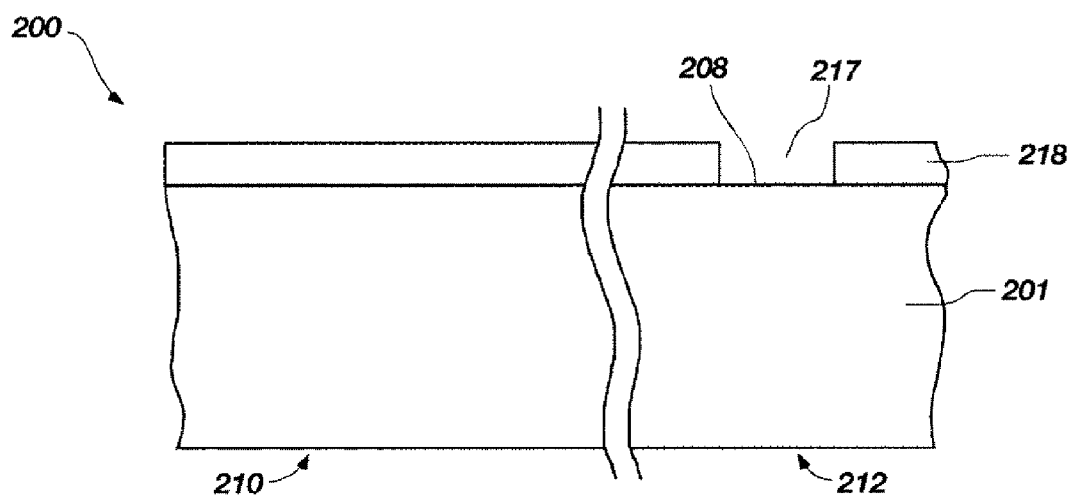

Turning now to FIG. 9, the semiconductor structure 20 is depicted with a region of the upper surface 208 of the substrate 201 exposed through an aperture 217 in an overlying mask material 218. By way of non-limiting example, the mask material 218 may be a hardmask material, such as transparent carbon or amorphous carbon, or a photoresist material. The mask material 218 may be patterned to form the aperture 217 exposing a region of the upper surface 208 of the substrate 201 using conventional photomask forming and/or transparent carbon mask forming and etching techniques.

Figure 10:
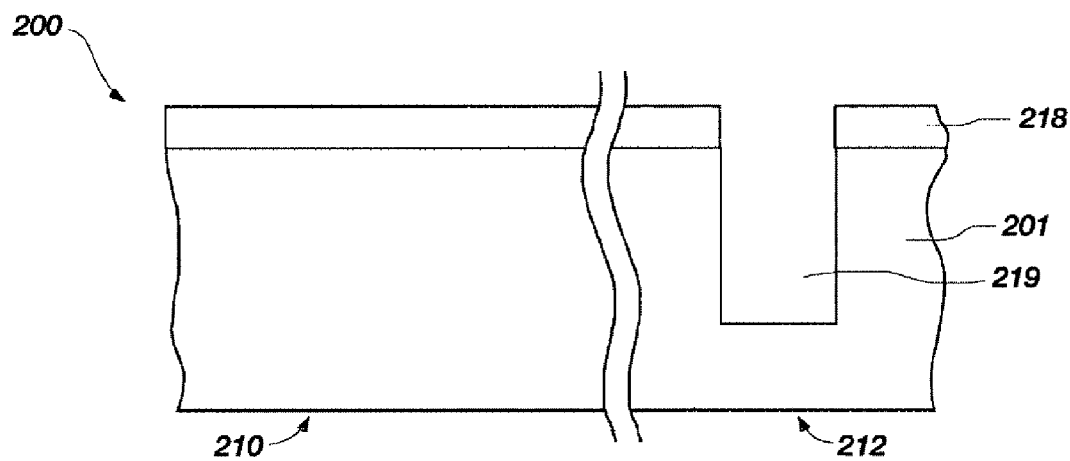

As shown in FIG. 10, removal of a portion of the substrate 201 exposed through the aperture 217 may be conducted to form a trench 219 in the substrate 201. For example, if the substrate 201 is formed from silicon, the trench 219 may be formed by etching silicon with a solution containing nitric acid ($HNO_3$), water ($H_2O$) and hydrogen fluoride in a ratio of 50:20:1.

Figure 11:
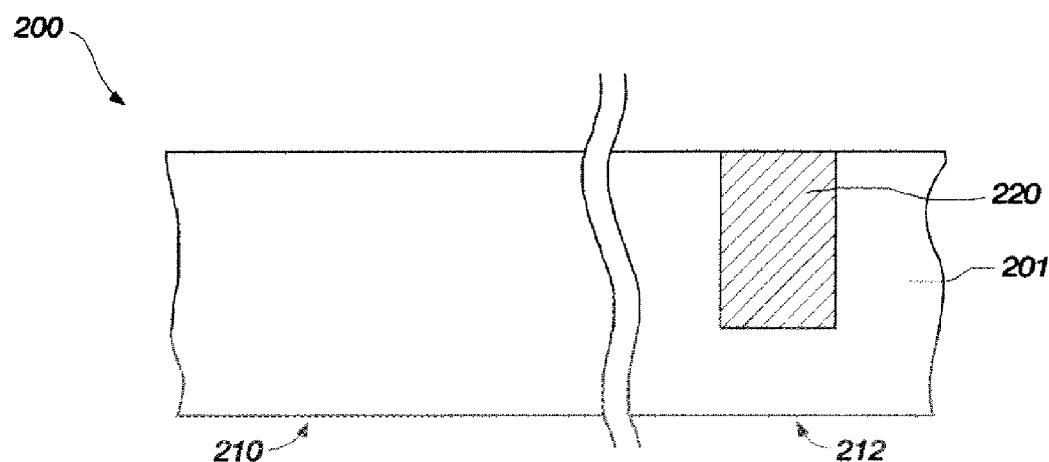

A trench-filling material 220 may be applied over the substrate 201 to fill the trench 219, as depicted in FIG. 11. By way of non-limiting example, the trench-filling material 220 may be a low-k dielectric material, a high-k dielectric material, a nitride material, or an oxide material. In one example, the trench 219 may be filled by depositing silicon dioxide by RDP deposition.

Figure 12:
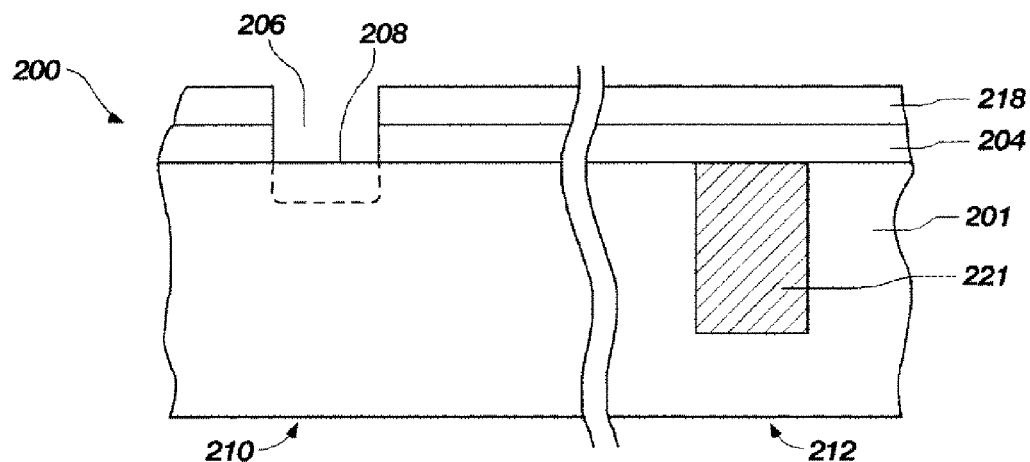

Referring to FIG. 12, portions of the trench-filling material 220 overlying the upper surface 208 of the substrate 201 may be removed to form an embedded isolation structure 221. The embedded isolation structure 221 may have a height of about 0.2 µm. Subsequent to formation of the embedded isolation structure 221, a dielectric material 204 and a mask material 218 may be applied, respectively, over the substrate 201. The dielectric material 204 may include, but is not limited to, a low-k dielectric, a high-k dielectric, an oxide material or a nitride material and may be deposited on the surface of the substrate 201 by PVD, CVD, and the like. The dielectric material 204 may be a material capable of being removed selectively with relative to the trench-filling material 220 and the substrate 201. The mask material 218 may be a photoresist material or a hardmask material, such as amorphous carbon or transparent carbon. As a non-limiting example, the photoresist material may be applied and patterned by techniques known in the art to form the aperture (not shown) in the mask material 218 that exposes a region of the dielectric material 204. The dielectric material 204 exposed through the aperture in the mask material 218 may be removed to form the opening 206. For example, if the dielectric material 204 is formed from silicon nitride and the mask material 218 is formed from a photoresist material, a hot phosphoric acid etch may be employed to remove silicon nitride through the aperture in the photoresist material.

In some embodiments, the opening 206 may be extended into the substrate 201 by removing a portion of the substrate 201 as shown in phantom in FIG. 12. For example, if the substrate 201 is formed from silicon, and the mask material 218 is a photoresist material, the opening 206 may be extended using reactive ion etching (RIE) to remove silicon. Alternatively, the opening 206 may be extended into the substrate 201 after removal of the mask material 218 using the dielectric material 204 as a mask. In other words, a portion of the substrate 201 may be selectively removed with respect to the dielectric material 204. If the dielectric material 204 is formed from silicon nitride and the substrate 201 is formed from silicon, a hot potassium hydroxide (KOH) wet etch may be employed, for example, to remove a portion of the substrate 201 without removing the dielectric material 204.

Figure 13:
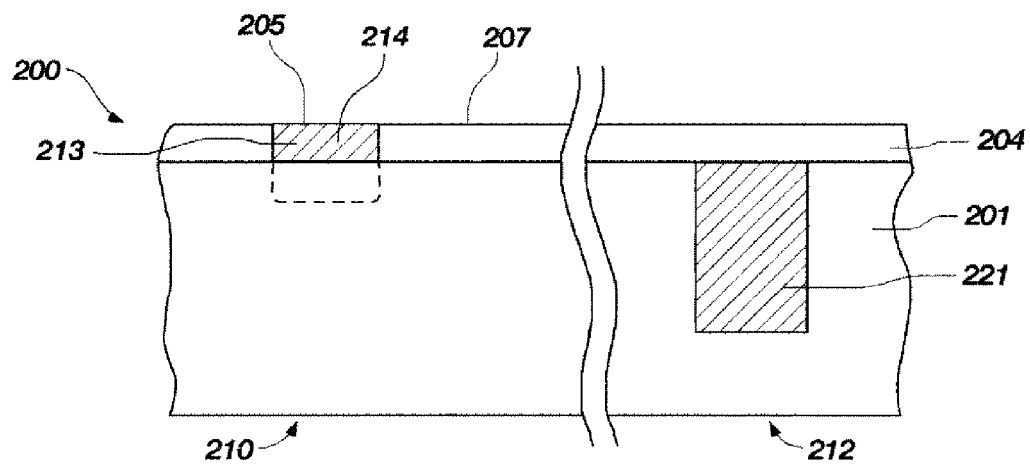

After removal of the mask material 218, an opening-filling material 213 may be applied over the dielectric material 204 to fill the opening 206, as shown in FIG. 13. The opening-filling material 213 may be a dielectric material including, but not limited to, low-k dielectric materials, high-k dielectric materials, nitride materials, or oxide materials. The opening-filling material 213 and the dielectric material 204 may be materials capable of being selectively etched with respect to one another. By way of non-limiting example, the opening-filling material 213 may be silicon dioxide deposited over the dielectric material 204 by HDP deposition. Portions of the opening-filling material 213 overlying the dielectric material 204 may be removed to form a protruding isolation structure 214 with an upper surface 205 substantially coplanar with an upper surface 207 of the dielectric material 204. As a non-limiting example, the protruding isolation structure 214 may have a height in the range of from about 0.1 µm to about 0.2 µm.

Figure 14:
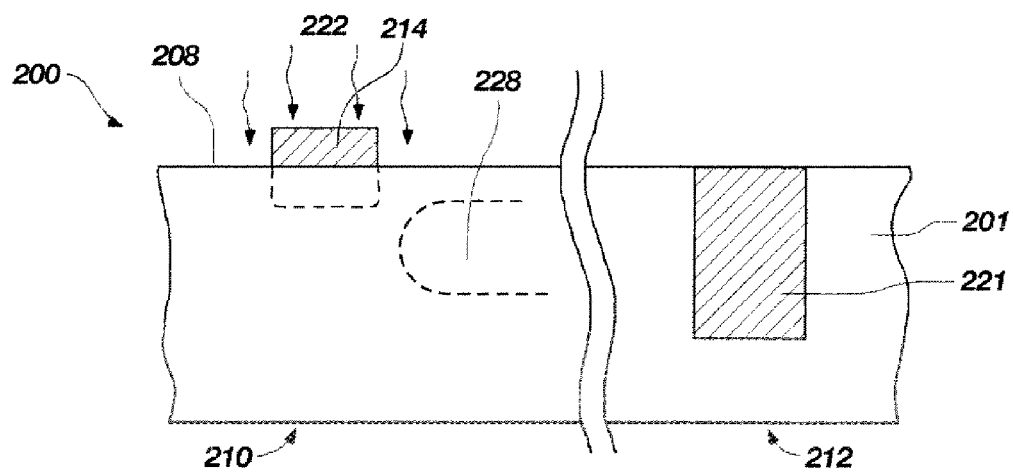

Referring to FIG. 14, the dielectric material 204 may be selectively removed relative to the protruding isolation structure 214 and the embedded isolation structure 221 to form the semiconductor structure 200 with dual isolation structures. For example, if the substrate 201 is formed from silicon and the protruding isolation structure 214 and the embedded isolation structure 221 are formed from silicon dioxide, the dielectric material 204 may be, for example, silicon nitride. Thus, a hot phosphoric acid etch may be performed to selectively etch the dielectric material 204 with respect to the protruding isolation structure 214 and the embedded isolation structure 221 and the substrate 201. Other combinations of materials and etch chemistries known in the art may be used to perform the method described herein.

The resulting semiconductor structure 200 includes dual isolation structures in the form of a protruding isolation structure 214 and an embedded isolation structure 221. The protruding isolation structure 214 may be formed in a pixel array region 210 of the substrate 201. At least a portion of the protruding isolation structure 214 may extend from the surface 208 of the substrate 201, while a remaining portion may extend into the substrate 201 (as shown in phantom). The embedded isolation structure 221 may be embedded within a peripheral device region 212 of the substrate 201.

Referring again to FIG. 14, the protruding isolation structure 214 and embedded isolation structure 221 may optionally be employed as a mask for doping the substrate 201 by ion implantation 222. For example, the substrate 201 may be doped using ion implantation 222 to form an n-well region 228 while the material of the substrate 201 underlying the protruding isolation structure 214 and embedded isolation structure 221 is protected from the implantation. Using the protruding isolation structure 214 and embedded isolation structure 221 as a self-aligned mask may reduce dark current (or current leakage) by producing n-well region 228 and, thus, a p-n junction, at a distance from the surface of the substrate 201 while eliminating a process act.

Figure 1:
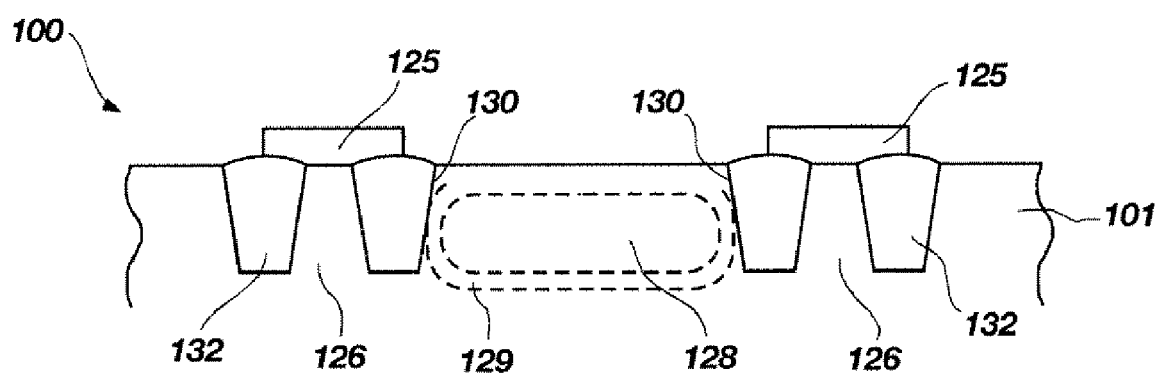
FIG. 1 is a cross-sectional view of a conventional semiconductor structure that may be employed as a photodiode.
Figure 15:
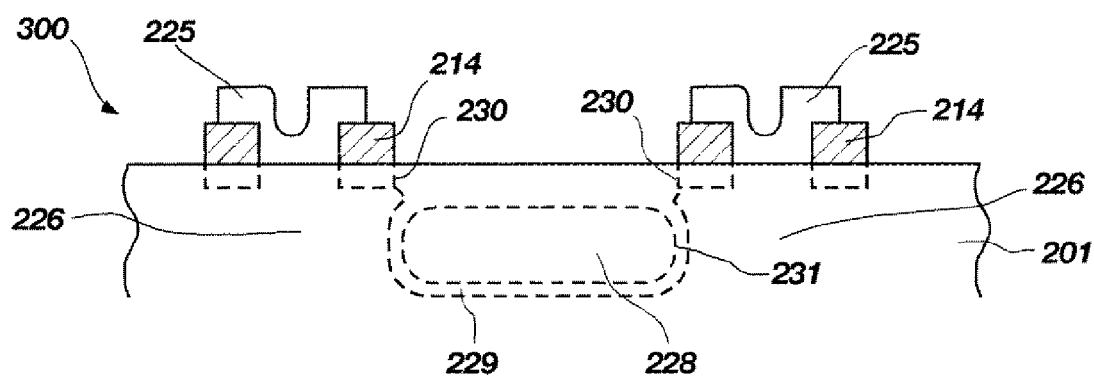
FIG. 15 is a cross-sectional view of a semiconductor structure according to embodiments of the present invention.

As depicted in FIG. 15, the protruding isolation structure 214 formed by the methods described herein may be employed in forming photodiodes 300. The photodiodes 300 include a protruding isolation structure 214 formed on the surface of the substrate 201 or a protruding isolation structure 214 partially within the substrate 201 (as shown in phantom). The substrate 201 may be formed from a p-type material or may be implanted with p-type ions to form p-well regions 226. The n-well region 228 may be formed by implanting n-type ions in the substrate 201. A conductive gate 225 formed over the protruding isolation structure 214 may be used to bias the photodiode 300. As electrons move out of the n-well region 228, a depletion region 229 is formed with vertical surfaces 230 extending toward p-well regions 226. Fabrication of dual isolation structures by the methods described herein enables a cleaner interface area between the vertical surfaces 230 in the substrate 201 and the depletion region 229 and, thus, may reduce or eliminate accumulation of electron hole pairs associated with dark current effects in the photodiode 300. Moreover, a reduction in the area of contact between the depletion region 229 and the protruding isolation structure 214 may further reduce dark current compared to conventional STIs, such as depicted in those FIG. 1. The n-well region 228 may be formed by employing the protruding isolation structure 214 as an ion implantation mask, thus eliminating process acts and decreasing dark current by enabling formation of the p-n junction at a distance from the surface of the substrate 201.

By decreasing the interaction between the depletion region 229 and damaged vertical surfaces of the substrate 201 and reducing the electron hole pair accumulation at damaged surfaces resulting from removal of the substrate 201, the embodiments described herein enable increased channel control while decreasing the effects of surface related damage, such as dark current. Moreover, the methods described herein reduce the number of masking acts and the expense of photodiode fabrication.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the scope of the invention as defined by the following appended claims and their legal equivalents.

What is claimed is:

1. An imaging device, comprising:
a pixel array region comprising at least one protruding isolation structure comprising a first oxide region that extends above an upper surface of a substrate and a second oxide region that extends downward from the first oxide region and that is embedded within the substrate below the upper surface; and
a peripheral device region comprising at least one embedded oxide isolation structure, wherein the embedded oxide isolation structure has an upper surface that is substantially coplanar with the upper surface of the substrate and that does not extend above the upper surface.

* * * * *